United States Patent
Chen

(10) Patent No.: US 12,191,167 B2
(45) Date of Patent: Jan. 7, 2025

(54) VACUUM SYSTEM, LOW-PRESSURE VACUUM PROCESS DEVICE, AND CUTOFF MEMBER

(71) Applicant: CHANGXIN MEMORY TECHNOLOGIES, INC., Hefei (CN)

(72) Inventor: Tao Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 401 days.

(21) Appl. No.: 17/648,469

(22) Filed: Jan. 20, 2022

(65) Prior Publication Data

US 2023/0008620 A1    Jan. 12, 2023

Related U.S. Application Data

(63) Continuation of application No. PCT/CN2021/117520, filed on Sep. 9, 2021.

(30) Foreign Application Priority Data

Jul. 9, 2021   (CN) .......................... 202110777369.3

(51) Int. Cl.
*B01D 53/34* (2006.01)
*B01D 45/02* (2006.01)
(Continued)

(52) U.S. Cl.
CPC ........ *H01L 21/67069* (2013.01); *B01D 45/02* (2013.01); *B01D 46/24* (2013.01);
(Continued)

(58) Field of Classification Search
None
See application file for complete search history.

(56) References Cited

U.S. PATENT DOCUMENTS

2011/0263084 A1* 10/2011 Yamazaki ......... H01L 29/66969
438/161
2013/0203264 A1*  8/2013 Liu .................... B01D 39/2044
55/482
(Continued)

FOREIGN PATENT DOCUMENTS

CN         101121089 A       2/2008
CN         201337859 Y      11/2009
(Continued)

OTHER PUBLICATIONS

KR20130084953A_ENG (Espacenet machine translation of Shim) (Year: 2013).*

(Continued)

*Primary Examiner* — Jonathan Miller
(74) *Attorney, Agent, or Firm* — Kilpatrick Townsend & Stockton LLP

(57) ABSTRACT

The present disclosure relates to the technical field of semiconductors, and provides a vacuum system, a low-pressure vacuum process device, and a cutoff member. The vacuum system includes: a vacuum pump; an exhaust pipeline, wherein one end of the exhaust pipeline is used to communicate with a chamber to be evacuated, and the other end of the exhaust pipeline communicates with the vacuum pump; and a cutoff member, wherein the cutoff member is connected to the exhaust pipeline, the cutoff member includes a filter portion and a carrier portion, the filter portion includes a passage, the carrier portion includes an accommodation groove, and the passage communicates with the accommodation groove.

11 Claims, 4 Drawing Sheets

(51) Int. Cl.
  *B01D 46/24* (2006.01)
  *G03F 7/00* (2006.01)
  *H01L 21/67* (2006.01)
  *B01D 46/00* (2022.01)

(52) U.S. Cl.
  CPC ......... *B01D 53/34* (2013.01); *G03F 7/70916* (2013.01); *H01L 21/67017* (2013.01); *B01D 46/0005* (2013.01); *B01D 46/0012* (2013.01); *B01D 46/2403* (2013.01); *B01D 2258/0216* (2013.01); *Y10T 137/86083* (2015.04)

(56) References Cited

U.S. PATENT DOCUMENTS

| | | | |
|---|---|---|---|
| 2019/0331070 | A1* | 10/2019 | Kendall ............... F02M 35/042 |
| 2021/0162326 | A1* | 6/2021 | Gingerich .............. B01D 46/24 |

FOREIGN PATENT DOCUMENTS

| | | | | | |
|---|---|---|---|---|---|
| CN | 201339559 | Y | | 11/2009 | |
| CN | 103088432 | A | | 5/2013 | |
| CN | 103615368 | A | | 3/2014 | |
| CN | 104096428 | A | * | 10/2014 | |
| CN | 205533070 | U | | 8/2016 | |
| CN | 207813854 | U | | 9/2018 | |
| CN | 109003913 | A | | 12/2018 | |
| CN | 208587296 | U | | 3/2019 | |
| CN | 208599682 | U | | 3/2019 | |
| CN | 209481791 | U | | 10/2019 | |
| CN | 210033755 | U | | 2/2020 | |
| CN | 111111333 | A | | 5/2020 | |
| CN | 111749873 | A | | 10/2020 | |
| CN | 212130745 | U | | 12/2020 | |
| CN | 212774645 | U | | 3/2021 | |
| CN | 212774681 | U | | 3/2021 | |
| CN | 213116608 | U | * | 5/2021 | |
| JP | 2010269210 | A | | 12/2010 | |
| KR | 20130084953 | A | * | 7/2013 | ....... H01L 21/67017 |
| KR | 101678154 | B1 | * | 11/2016 | ............. H01L 21/02 |

OTHER PUBLICATIONS

CN104096428A_ENG (Espacenet machine translation of Chen) (Year: 2014).*
KR101678154B1-preview (IP.com machine translation of Cho) (Year: 2016).*
CN213116608U_ENG (Espacenet machine translation of Gu) (Year: 2021).*
International Search Report cited in PCT/CN2021/117520 mailed Jan. 14, 2022, 9 pages.
First Office Action cited in CN202110777369.3 mailed Mar. 16, 2022, 19 pages.

* cited by examiner

VACUUM SYSTEM, LOW-PRESSURE VACUUM PROCESS DEVICE, AND CUTOFF MEMBER

CROSS-REFERENCE TO RELATED APPLICATIONS

This is a continuation of International Application No. PCT/CN2021/117520, filed on Sep. 9, 2021, which claims the priority to Chinese Patent Application No. 202110777369.3, titled "VACUUM SYSTEM, LOW-PRESSURE VACUUM PROCESS DEVICE, AND CUTOFF MEMBER" and filed on Jul. 9, 2021. The entire contents of International Application No. PCT/CN2021/117520 and Chinese Patent Application No. 202110777369.3 are incorporated herein by reference.

TECHNICAL FIELD

The present disclosure relates to the technical field of semiconductors, and in particular, to a vacuum system, a low-pressure vacuum process device, and a cutoff member.

BACKGROUND

In an existing low-pressure vacuum process device, the interior of a chamber communicates with a vacuum system. During manufacturing of a wafer, different by-products/particulate matters and exhaust gas are produced in different processes.

Some of the by-products produced remain inside the chamber, and some are discharged through the vacuum system. In this process, the particulate by-products are adsorbed on an inner wall of the vacuum system, and accumulated by-products easily enter a vacuum pump, affecting normal operation of the vacuum pump.

SUMMARY

The present disclosure provides a vacuum system, a low-pressure vacuum process device, and a cutoff member.

According to a first aspect of the present disclosure, a vacuum system is provided, including:
a vacuum pump;
an exhaust pipeline, wherein one end of the exhaust pipeline is used to communicate with a chamber to be evacuated, and the other end of the exhaust pipeline communicates with the vacuum pump; and
a cutoff member, wherein the cutoff member is connected to the exhaust pipeline, the cutoff member includes a filter portion and a carrier portion, the filter portion includes a passage, the carrier portion includes an accommodation groove, and the passage communicates with the accommodation groove.

According to a second aspect of the present disclosure, a low-pressure vacuum process device is provided, including the vacuum system and the chamber described above.

According to a third aspect of the present disclosure, a cutoff member is provided, including:
a filter portion, wherein the filter portion includes a passage; and
a carrier portion, wherein the carrier portion is connected to the filter portion, the carrier portion includes an accommodation groove, and the passage communicates with the accommodation groove.

BRIEF DESCRIPTION OF THE DRAWINGS

The preferred embodiments of the present disclosure are described in detail below with reference to the accompanying drawings to make the objectives, features and advantages of the present disclosure more obvious. The drawings are merely exemplary illustrations of the present disclosure, and are not necessarily drawn to scale. The same reference numerals in the drawings always represent the same parts. In the drawings.

DETAILED DESCRIPTION

Figure 1:
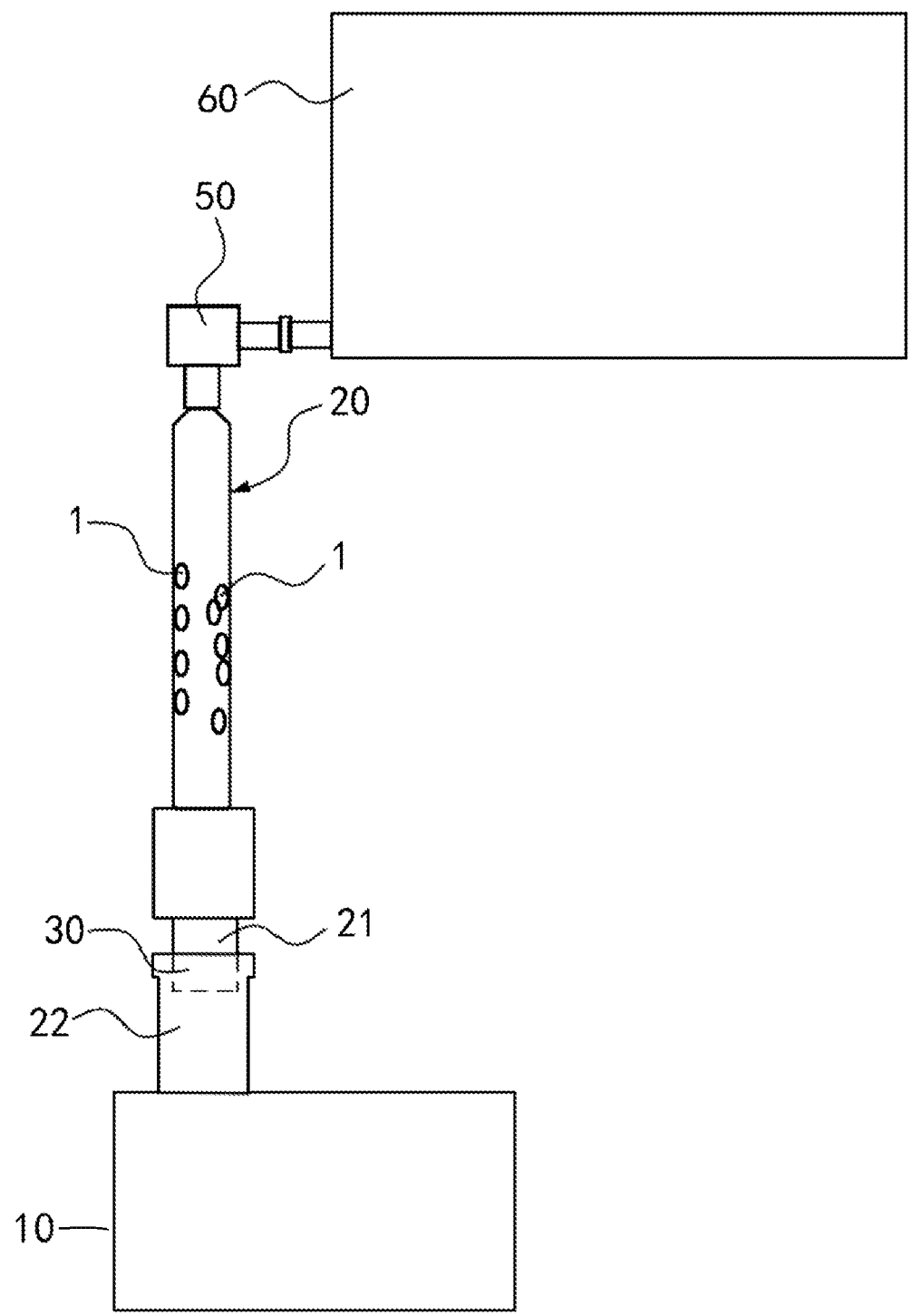
FIG. 1 is a schematic structural diagram of a low-pressure vacuum process device according to an exemplary implementation.

The typical embodiments embodying the features and advantages of the present disclosure are described in detail below. It should be understood that the present disclosure may have various changes in different embodiments, which do not depart from the scope of the present disclosure. The description and drawings herein are essentially used for the purpose of explanation, rather than limiting the present disclosure.

Different exemplary embodiments of the present disclosure are described below with reference to the accompanying drawings. The accompanying drawings form a part of the present disclosure, which show by way of example different exemplary structures, systems and steps that can implement various aspects of the present disclosure. It should be understood that other specific solutions of components, structures, exemplary devices, systems and steps may be used, and structural and functional modifications may be made without departing from the scope of the present disclosure. Moreover, although the terms such as "above", "between" and "within" may be used in this specification to describe different exemplary features and elements of the present disclosure, these terms are used herein only for convenience of description, for example, according to the directions of the examples in the drawings. Nothing in this specification should be understood as requiring a specific three-dimensional direction of the structure to fall within the scope of the present disclosure.

An embodiment of the present disclosure provides a vacuum system. Referring to FIG. 1 to FIG. 4, the vacuum system includes: a vacuum pump 10; an exhaust pipeline 20, wherein one end of the exhaust pipeline 20 is used to communicate with a chamber 60 to be evacuated, and the other end of the exhaust pipeline 20 communicates with the vacuum pump 10; and a cutoff member 30, wherein the cutoff member 30 is connected to the exhaust pipeline 20, the cutoff member 30 includes a filter portion 31 and a carrier portion 32, the filter portion 31 includes a passage, the carrier portion 32 includes an accommodation groove 321, and the passage communicates with the accommodation groove 321.

The vacuum system of this embodiment of the present disclosure includes the vacuum pump 10, the exhaust pipeline 20, and the cutoff member 30. A gas in the chamber 60 enters the vacuum pump 10 through the exhaust pipeline 20, and before the gas enters the vacuum pump 10, the cutoff member 30 cuts off the particulate matters 1 in the gas, such that the particulate matters 1 carried in the gas are cut off in the filter portion 31 of the cutoff member 30, and the particulate matters 1 can be discharged from the filter portion 31 into the carrier portion 32 for storage. This ensures that the gas discharged from the filter portion 31 does not carry the particulate matters 1, thus prevents the particulate matters 1 from entering the vacuum pump 10, and ensures that the vacuum pump 10 can operate normally, thereby improving service performance of the vacuum system.

It should be noted that, the gas discharged from the chamber 60 may enter the exhaust pipeline 20 first, and flows through the cutoff member 30 when flowing in the exhaust pipeline 20, such that the cutoff member 30 cuts off the particulate matters 1. Alternatively, the gas discharged from the chamber 60 may directly enter the cutoff member 30 to cut off the particulate matters 1, and then enter the vacuum pump 10 through the exhaust pipeline 20, which is not limited herein.

In some embodiments, a complete exhaust passage is formed between the chamber 60 and the vacuum pump 10, and the exhaust passage may be formed by the exhaust pipeline 20, that is, two ends of the exhaust pipeline 20 are directly connected to the chamber 60 and the vacuum pump 10. In this case, the cutoff member 30 is disposed on the exhaust passage. Therefore, when the gas flows through the cutoff member 30, the cutoff member 30 cuts off the particulate matters 1, thereby preventing the particulate matters 1 from entering the vacuum pump 10. Alternatively, the exhaust pipeline 20 and the cutoff member 30 jointly form the exhaust passage, that is, the cutoff member 30 is connected to the exhaust pipeline 20. The cutoff member 30 may be connected to an end portion of the exhaust pipeline 20, or the cutoff member 30 may be connected to a middle portion of the exhaust pipeline 20. In this case, the exhaust pipeline 20 may include at least two pipe sections (for example, a first pipe section 21 and a second pipe section 22). A manner in which the exhaust pipeline 20 is connected to the cutoff member 30 and a manner of mounting the exhaust pipeline 20 and the cutoff member 30 are not limited herein, as long as it is ensured that the cutoff member 30 can cut off the particulate matters 1, that is, the gas needs to flow through the cutoff member 30 before entering the vacuum pump 10.

It should be noted that, the passage is used for the gas and the particulate matters 1 entering the vacuum system from the chamber 60 to flow. The gas flows in the passage, such that the gas carrying the particulate matters 1 can be prevented from entering the vacuum pump 10. The particulate matters 1 can flow through the passage into the accommodation groove 321 for collection. Specifically, the passage communicates with the exhaust pipeline 20, such that the gas entering the vacuum system from the chamber 60 flows in the passage after entering the filter portion 31 and is discharged from the passage to enter the vacuum pump 10, and the particulate matters 1 cut off by the filter portion 31 enter the accommodation groove 321 through the passage.

In some embodiments, an aperture of the passage may be 2 mm to 8 mm, and specifically, may be 3 mm to 5 mm, such that an airflow is not obstructed and impurities can be blocked within the range.

In some embodiments, the vacuum pump 10 may be provided with a rotating wheel, to facilitate movement of the vacuum pump 10.

Figure 3:
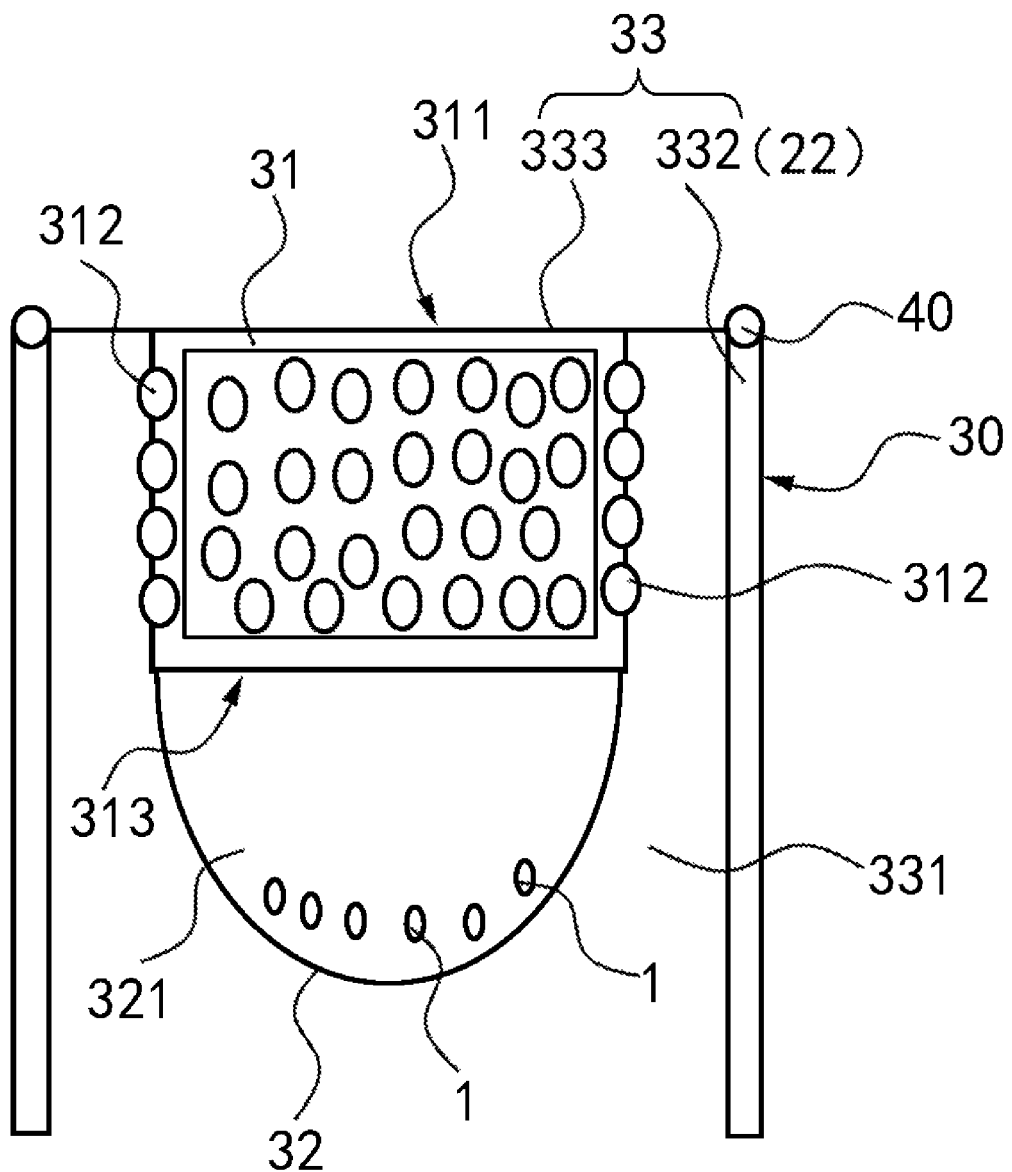
FIG. 3 is a schematic structural diagram of a cutoff member and a sealing member of a low-pressure vacuum process device according to an exemplary implementation.
Figure 4:
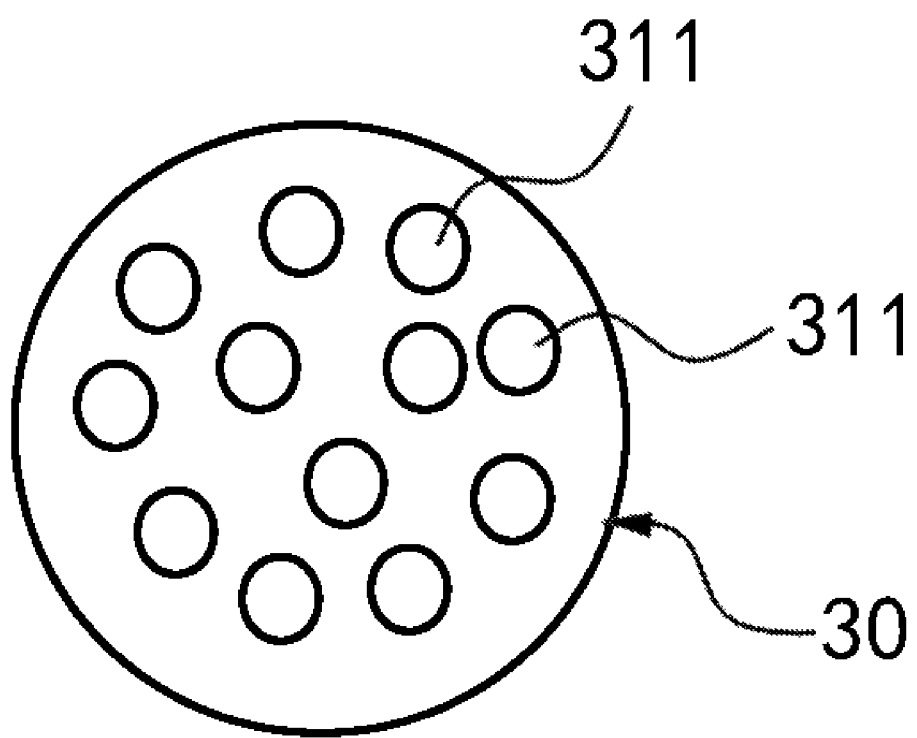
FIG. 4 is a top view of a cutoff member of a low-pressure vacuum process device according to an exemplary implementation.

In an embodiment, as shown in FIG. 3 and FIG. 4, the passage includes an air intake end 311, an air exhaust end 312, and a discharge end 313. The air intake end 311 is used for the gas to flow into the passage. The air exhaust end 312 is used for the gas to flow out of the passage. The discharge end 313 is used for the particulate matters 1 to enter the accommodation groove 321.

Optionally, the passage may include a first hole section and a second hole section, the first hole section may include an air intake end 311 and a discharge end 313, and the second hole section may include an air exhaust end 312, that is, the gas and the particulate matters 1 enter the filter portion 31 through the first hole section, and the particulate matters 1 are discharged into the carrier portion 32 through the first hole section. In this case, two ends of the first hole section are the air intake end 311 and the discharge end 313. The second hole section communicates with the first hole section. One end of the second hole section away from the first hole section is the air exhaust end 312.

Optionally, the passage may include a first hole section, a second hole section, and a third hole section, the first hole section may include an air intake end 311, the second hole section may include an air exhaust end 312, the third hole section may include a discharge end 313, and the first hole section, the second hole section, and the third hole section communicate with one another. The gas and the particulate matters 1 enter the filter portion 31 through the first hole section, the gas is discharged out of the filter portion 31 through the second hole section, and the particulate matters 1 are discharged into the carrier portion 32 through the third hole section. A cross-sectional area of each of the first hole section and the third hole section is greater than that of the second hole section, such that it can be ensured that the particulate matters 1 do not enter the second hole section but can pass through the first hole section and the third hole section.

In an embodiment, the filter portion 31 is connected to the carrier portion 32, that is, the carrier portion 32 is connected to one side of the filter portion 31 close to the passage wherein the particulate matters 1 are discharged, such that it can be ensured that the particulate matters 1 can enter the accommodation groove 321 through the passage. Further, the carrier portion 32 is connected to one side of the filter portion 31 close to the discharge end 313.

It should be noted that, the particulate matters 1 in the filter portion 31 can enter the accommodation groove 321 from the discharge end 313 by its own weight. Certainly, it is not excluded that the particulate matters 1 enter the accommodation groove 321 along with the gas. In this embodiment, the carrier portion 32 is connected below the filter portion 31. Therefore, the particulate matters 1 can fall into the accommodation groove 321 under action of weight.

In an embodiment, the filter portion 31 and the carrier portion 32 are of an integrated structure, to ensure stability of the structure.

It should be noted that, the integrated structure may be that the filter portion 31 and the carrier portion 32 are integrally formed. Alternatively, the filter portion 31 and the carrier portion 32 may be independently formed and then connected, for example, by welding, or by using a fastener, which is not limited herein.

In an embodiment, the filter portion 31 and the carrier portion 32 are made of a metal material, to ensure a service life of the structure and stability of the structure is high.

In an embodiment, the filter portion 31 and the carrier portion 32 are made of stainless steel, to prevent the gas from corroding the filter portion 31 and the carrier portion 32 and further extend a service life of the cutoff member 30. The filter portion 31 and the carrier portion 32 may be made of SUS304 material.

It should be noted that, the filter portion 31 may be formed by providing an air intake end 311, an air exhaust end 312, and an discharge end 313 on a physical stainless steel member, and the carrier portion 32 may be a stainless steel member having an accommodation groove 321, such that the filter portion 31 cuts off the particulate matters 1, and the carrier portion 32 carries the particulate matters 1, thereby preventing the particulate matters 1 from entering the vacuum pump 10.

Specifically, the filter portion 31 is used to filter the particulate matters 1 in the gas. The gas entering the vacuum system from the chamber 60 enters the filter portion 31 through the air intake end 311 and is then discharged through the air exhaust end 312 to enter the vacuum pump 10. The particulate matters 1 cut off by the filter portion 31 enter the accommodation groove 321 through the discharge end 313.

In an embodiment, a cross-sectional area of the accommodation groove 321 decreases gradually from a groove opening of the accommodation groove 321 to a groove bottom of the accommodation groove 321, that is, the accommodation groove 321 may be a gradually contracting structure from top to bottom, such that it can be ensured that the particulate matters 1 can be gradually stacked into the accommodation groove 321 along a groove wall of the accommodation groove 321, thereby ensuring that the space in the accommodation groove 321 is effectively utilized and a problem of much local stacking does not easily occur.

In an embodiment, a groove wall of the accommodation groove 321 includes a first curved surface, and an outer surface of the carrier portion 32 includes a second curved surface, that is, a structure of the carrier portion 32 may be similar a hemispherical structure. For details, refer to FIG. 3.

Specifically, a shape of the filter portion 31 may be similar to a cylinder structure, the carrier portion 32 may be similar to a hemispherical structure, and the filter portion 31 is connected to the carrier portion 32. In this way, the structure shown in FIG. 3 is formed. In this case, the particulate matters 1 may fall into the carrier portion 32 from top to bottom for collection.

Figure 2:
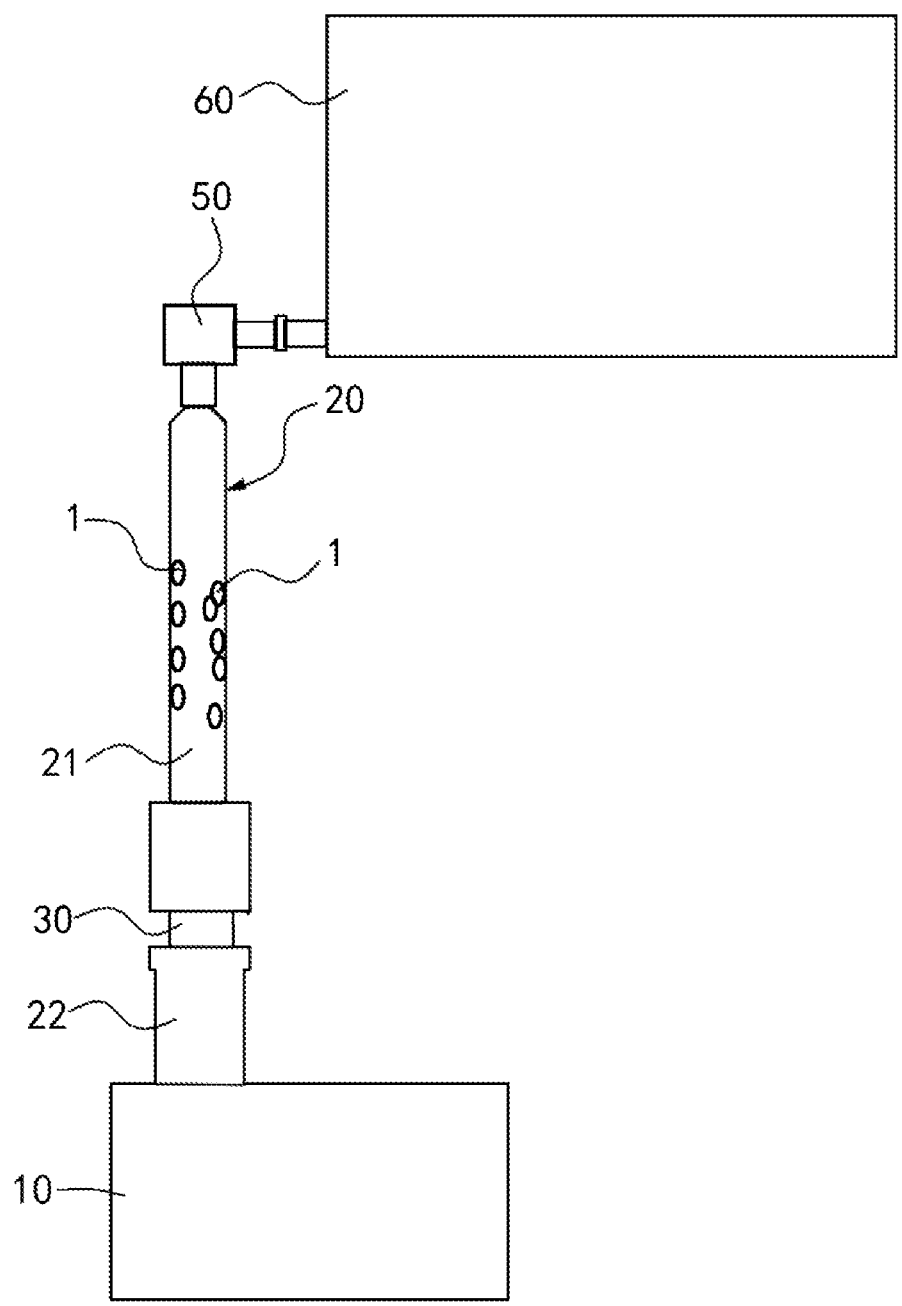
FIG. 2 is a schematic structural diagram of a low-pressure vacuum process device according to another exemplary implementation.

In an embodiment, the air intake end 311 and the discharge end 313 are arranged opposite to each other and are respectively located at two opposite ends of the filter portion 31, and one end of the filter portion 31 with the discharge end 313 is connected to the carrier portion 32, as shown in FIG. 2. The air intake end 311 may be a plurality of end portions separately distributed on the filter portion 31, or the air intake end 311 may be one large opening, and the air exhaust end 312 and the discharge end 313 separately communicate with this large opening, that is, the air intake end 311, the air exhaust end 312, and the discharge end 313 communicate with one another through the passage.

In an embodiment, the air exhaust end 312 is located on a circumferential outer surface of the filter portion 31, thereby ensuring that the gas can be reliably discharged from the filter portion 31 through the air exhaust end 312.

In an embodiment, there are a plurality of air exhaust ends 312, and the plurality of air exhaust end 312 can ensure that the gas does not form a blockage in the filter portion 31. An aperture at the air exhaust end 312 ranges from 3 mm to 5 mm, which does not block an airflow but can block impurities. Correspondingly, there are also a plurality of discharge ends 313.

Further, a plurality of air exhaust ends 312 are arranged as a honeycomb structure, that is, the circumferential outer surface of the filter portion 31 is arranged with the air exhaust ends 312, to ensure that the gas can be smoothly discharged from the filter portion 31, and the particulate matters 1 are reliably cut off by the filter portion 31.

In an embodiment, as shown in FIG. 1, the cutoff member 30 is located in the exhaust pipeline 20, and both the air intake end 311 and the air exhaust end 312 communicate with the exhaust pipeline 20, to ensure that the gas can enter the filter portion 31 through the exhaust pipeline 20, is discharged into the exhaust pipeline 20 again from the filter portion 31, and finally flow into the vacuum pump 10.

The cutoff member 30 may be inserted into the exhaust pipeline 20, as long as it can be ensured that the filter portion 31 and a pipe wall of the exhaust pipeline 20 are sealed, that is, the gas and the particulate matters 1 are prevented from directly flowing between the filter portion 31 and the pipe wall of the exhaust pipeline 20. In this case, it is necessary to ensure that there is a gap between the air intake end 311 and the pipe wall of the exhaust pipeline 20, that is, the gas can enter the air intake end 311, and there is a gap between the air exhaust end 312 and the pipe wall of the exhaust pipeline 20, that is, the gas can be discharged into the exhaust pipeline 20 through the air exhaust end 312.

Further, the cutoff member 30 is located at one end of the exhaust pipeline 20 close to the vacuum pump 10, the particulate matters 1 may enter the exhaust pipeline 20, such that the exhaust pipeline 20 can serve, to a certain extent, as a collection structure for the particulate matters 1. As shown in FIG. 1, the particulate matters 1 may be attached to the pipe wall of the exhaust pipeline 20. However, the particulate matters 1 do not enter the vacuum pump 10 due to the existence of the cutoff member 30, such that a cleaning process of the cutoff member 30 can be reduced.

In an embodiment, as shown in FIG. 2, the cutoff member 30 is located outside the exhaust pipeline 20, that is, at least a part of the cutoff member 30 is located outside the exhaust pipeline 20, such that the cutoff member 30 also constitutes a part of a flow passage of the gas.

In an embodiment, as shown in FIG. 3, the cutoff member 30 further includes a body portion 33, and the body portion 33 is connected to the exhaust pipeline 20. The body portion 33 has an accommodation space 331. Both the filter portion 31 and the carrier portion 32 are located inside the accommodation space 331. The air intake end 311 communicates with a pipe chamber of the exhaust pipeline 20. The air exhaust end 312 communicates with the accommodation space 331. The filter portion 31 is connected to the carrier portion 32, and the filter portion 31 may be connected to the body portion 33, thereby ensuring that the filter portion 31 and the carrier portion 32 are stably disposed in the accommodation space 331. In this case, a gap may be formed between the circumferential outer surface of the filter portion 31 and the body portion 33, thereby ensuring that the air exhaust end 312 communicates with the accommodation space 331, and an upper end of the filter portion 31 can directly communicate with the pipe chamber of the exhaust pipeline 20, that is, ensuring that the air intake end 311 communicates with the pipe chamber of the exhaust pipeline 20.

Specifically, one end of the filter portion 31 with the air intake end 311 may be connected to the body portion 33. As shown in FIG. 3, the body portion 33 includes a cylindrical pipe 332 and a horizontal connecting plate 333, and the filter portion 31 is connected to the horizontal connecting plate 333, such that both the filter portion 31 and the carrier portion 32 can be spaced apart from the cylindrical pipe 332.

The cylindrical pipe 332 may be directly connected to the exhaust pipeline 20, or the cylindrical pipe 332 may be plugged into the exhaust pipeline 20, which is not limited herein, as long as it can be ensured that the cylindrical pipe 332 and the exhaust pipeline 20 can be stably connected and reliable sealing can be ensured. In some embodiments, it is not excluded that the cylindrical pipe 332 is inserted into the exhaust pipeline 20 as a whole, that is, the cutoff member 30 shown in FIG. 3 is disposed in the exhaust pipeline 20 as a whole. For example, a groove may be arranged in the second pipe section 22 to dispose the cylindrical pipe 332 in the groove, to implement connection to the exhaust pipeline 20.

Optionally, the body portion 33 may include a horizontal connecting plate 333, the filter portion 31 is connected to the horizontal connecting plate 333, and the cylindrical pipe 332 in FIG. 3 may be equal to the second pipe section 22 in FIG. 1. In this case, the body portion 33 is connected to the cylindrical pipe 332 through the horizontal connecting plate 333, that is, the cutoff member 30 is disposed in the second pipe section 22.

In an embodiment, a sealing member 40 is arranged between the body portion 33 and the exhaust pipeline 20. The arrangement of the sealing member 40 can ensure good sealing performance between the body portion 33 and the exhaust pipeline 20. As shown in FIG. 3, the sealing member 40 may be disposed at the top of the body portion 33.

In some embodiments, one end of the body portion 33 is connected to the exhaust pipeline 20, and the other end of the body portion 33 is connected to the vacuum pump 10, that is, after the gas in the exhaust pipeline 20 enters the filter portion 31, the filter portion 31 cuts off the particulate matters 1, and the gas discharged from the filter portion 31 may directly flow into the vacuum pump 10.

Optionally, with reference to FIG. 1 and FIG. 2, the exhaust pipeline 20 includes a first pipe section 21 and a second pipe section 22, one end of the body portion 33 is connected to the first pipe section 21, and the other end of the body portion 33 is connected to the second pipe section 22. The body portion 33 is clamped in the middle of the exhaust pipeline 20, that is, after the gas in the exhaust pipeline 20 enters the filter portion 31, the filter portion 31 cuts off the particulate matters 1, and the gas discharged from the filter portion 31 enters the exhaust pipeline 20 again and finally enters the vacuum pump 10.

Both the first pipe section 21 and the second pipe section 22 are detachably connected to the body portion 33, to facilitate subsequent maintenance, replacement, and the like. Both the first pipe section 21 and the second pipe section 22 may be rigid pipes, or one of the first pipe section 21 and the second pipe section 22 is a corrugated pipe, thus having a certain elastic space. Both the first pipe section 21 and the second pipe section 22 may be stainless steel pipes, for example, may be made of SUS304 or SUS316 material.

It should be noted that, the first pipe section 21 and the second pipe section 22 may each be a complete pipe section, or the first pipe section 21 and the second pipe section 22 may each consist of a plurality of pipe sections, which is not limited herein. In this embodiment, the first pipe section 21 may include a corrugated pipe and a rigid pipe.

In the vacuum system of the present disclosure, the cutoff member is arranged, such that a possibility of machine downtime due to process by-products (that is, the particulate matters 1) falling from the vacuum pump can be reduced, thereby reducing maintenance costs and improving production efficiency.

An embodiment of the present disclosure further provides a low-pressure vacuum process device. Referring to FIG. 1 and FIG. 2, the low-pressure vacuum process device includes the vacuum system and the chamber 60 described above.

The low-pressure vacuum process device of this embodiment of the present disclosure includes the vacuum system and the chamber 60. The vacuum system includes the vacuum pump 10, the exhaust pipeline 20, and the cutoff member 30. A gas in the chamber 60 enters the vacuum pump 10 through the exhaust pipeline 20, and before the gas enters the vacuum pump 10, the cutoff member 30 cuts off the particulate matters 1 in the gas, such that the particulate matters 1 carried in the gas are cut off in the filter portion 31 of the cutoff member 30, and the particulate matters 1 can be discharged from the filter portion 31 into the carrier portion 32 for storage. This ensures that the gas discharged from the filter portion 31 does not carry the particulate matters 1, thus prevents the particulate matters 1 from entering the vacuum pump 10, and ensures that the vacuum pump 10 can operate normally, thereby improving service performance of the vacuum system.

It should be noted that, the chamber 60 may include any semiconductor reaction chamber, such as a semiconductor dry etching reaction chamber or a vacuum coating reaction chamber, which is not limited herein.

In an embodiment, as shown in FIG. 1 and FIG. 2, a control valve 50 may be arranged between the exhaust pipeline 20 and the chamber 60. The communication and disconnection between the exhaust pipeline 20 and the chamber 60 are controlled by opening and closing the control valve 50. The control valve 50 may be an automatic valve. Certainly, the control valve 50 may alternatively be a manual valve.

Further, the low-pressure vacuum process device may further include a tail gas treatment device. The tail gas treatment device may communicate with the vacuum pump 10, to treat the gas extracted from the chamber 60 by the vacuum pump 10.

An embodiment of the present disclosure further provides a cutoff member. Referring to FIG. 3 and FIG. 4, the cutoff member includes: a filter portion 31, wherein the filter portion 31 includes a passage; and a carrier portion 32, wherein the carrier portion 32 is connected to the filter portion 31, the carrier portion 32 includes an accommodation groove 321, and the passage communicates with the accommodation groove 321.

The cutoff member 30 of this embodiment of the present disclosure can be applied to a vacuum system, to cut off particulate matters 1 in a gas, thereby preventing the particulate matters 1 from entering a vacuum pump 10 of the vacuum system. That is, the cutoff member 30 cuts off the particulate matters 1 in the gas, such that the particulate matters 1 carried in the gas are cut off in the filter portion 31 of the cutoff member 30, and the particulate matters 1 can be discharged from the filter portion 31 into the carrier portion 32 for storage. This ensures that the gas discharged from the filter portion 31 does not carry the particulate matters 1, thereby preventing the particulate matters 1 from entering the vacuum pump 10.

It should be noted that, other structures of the cutoff member 30 are not described herein, and reference may be made to the detailed description of the cutoff member 30 in the foregoing embodiment.

Those skilled in the art may easily figure out other implementations of the present disclosure after considering the specification and practicing the content disclosed herein. The present disclosure is intended to cover any variations, purposes or applicable changes of the present disclosure. Such variations, purposes or applicable changes follow the general principle of the present disclosure and include common knowledge or conventional technical means in the technical field which is not disclosed in the present disclosure. The specification and implementations are merely considered as illustrative, and the real scope and spirit of the present disclosure are directed by the appended claims.

It should be noted that, the present disclosure is not limited to the precise structures that have been described above and shown in the accompanying drawings, and can be modified and changed in many ways without departing from the scope of the present disclosure. The scope of the present disclosure is defined by the appended claims.

The invention claimed is:

1. A vacuum system, comprising:
a vacuum pump;
an exhaust pipeline, wherein one end of the exhaust pipeline communicates with a chamber to be evacuated, and the other end of the exhaust pipeline communicates with the vacuum pump;
a cutoff member connected to the exhaust pipeline, wherein the cutoff member comprises:
a filter portion provided with an air intake end with a plurality of first perforations, an air exhaust end with a plurality of second perforations arranged as a honeycomb structure, and a discharge end with a plurality of third perforations, the first perforations, the second perforations and the third perforations being communicated with each other, an aperture of each first perforation and an aperture of each second perforation being larger than an aperture of each third perforation; and, wherein the filter portion is similar to a cylinder structure, the air intake end and the discharge end are respectively arranged on the upper and lower surfaces of the cylinder structure, and the air exhaust end is arranged on a circumferential outer surface of the cylinder structure; and
a carrier portion positioned below and communicated with the filter portion, wherein the carrier portion is similar to a hollow hemispherical structure and an aperture of the hollow hemispherical structure gradually decreases in the direction away from the discharge end of the filter portion.

2. The vacuum system according to claim 1, wherein the filter portion and the carrier portion are of an integrated structure.

3. The vacuum system according to claim 2, wherein the filter portion and the carrier portion are made of a metal material.

4. The vacuum system according to claim 3, wherein the filter portion and the carrier portion are made of stainless steel.

5. The vacuum system according to claim 1, wherein the cutoff member is located inside the exhaust pipeline, or the cutoff member is located outside the exhaust pipeline.

6. The vacuum system according to claim 5, wherein a position of the cutoff member is closer to the vacuum pump than the chamber.

7. The vacuum system according to claim 1, wherein the cutoff member further comprises a body portion, and the body portion is connected to the exhaust pipeline; and
the body portion has an accommodation space, both the filter portion and the carrier portion are located inside the accommodation space, the filter portion communicates with a pipe chamber of the exhaust pipeline, and the filter portion communicates with the accommodation space.

8. The vacuum system according to claim 7, wherein a sealing member is arranged between the body portion and the exhaust pipeline.

9. The vacuum system according to claim 1, wherein the vacuum pump is provided with a rotating wheel.

10. The vacuum system according to claim 1, wherein the aperture of the air exhaust end ranges from 3 mm to 5 mm.

11. A cutoff member, comprising:
a filter portion provided with an air intake end with a plurality of first perforations, an air exhaust end with a plurality of second perforations arranged as a honeycomb structure, and a discharge end with a plurality of third perforations, the first perforations, the second perforations and the third perforations being communicated with each other, an aperture of each first perforation and an aperture of each second perforation being larger than an aperture of each third perforation; and, wherein the filter portion is similar to a cylinder structure, the air intake end and the discharge end are respectively arranged on the upper and lower surfaces of the cylinder structure, and the air exhaust end is arranged on a circumferential outer surface of the cylinder structure; and
a carrier portion, positioned below and communicated with the filter portion, wherein the carrier portion is similar to a hollow hemispherical structure and an aperture of the hollow hemispherical structure gradually decreases in the direction away from the discharge end of the filter portion.

* * * * *